United States Patent
Ma et al.

(10) Patent No.: US 10,218,370 B1
(45) Date of Patent: Feb. 26, 2019

(54) TEMPERATURE REFERENCE GAIN CORRECTION FOR ANALOG-TO-DIGITAL CONVERTER

(71) Applicant: Infineon Technologies AG, Neubiberg (DE)

(72) Inventors: Fan Yung Ma, Singapore (SG); Yu Fei Pan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/916,631

(22) Filed: Mar. 9, 2018

(51) Int. Cl.
    *H03M 1/06* (2006.01)
    *H03M 1/08* (2006.01)
    *H03M 1/10* (2006.01)

(52) U.S. Cl.
    CPC ......... *H03M 1/0604* (2013.01); *H03M 1/089* (2013.01); *H03M 1/1019* (2013.01)

(58) Field of Classification Search
    CPC ........ H03M 1/12; H03M 3/382; H03M 3/436; H03M 1/1019; H03M 1/1028; H03M 1/462; H03M 3/468; H03M 7/10; H03M 1/1009; H03M 3/38; H03M 1/089; H03M 1/1023
    USPC ......................................... 341/118–121, 155
    See application file for complete search history.

(56) References Cited

U.S. PATENT DOCUMENTS

| | | | | |
|---|---|---|---|---|
| 5,319,370 A | * | 6/1994 | Signore | H03M 1/1047 341/120 |
| 5,488,368 A | * | 1/1996 | Brown | G05F 3/18 327/326 |
| 5,822,225 A | * | 10/1998 | Quaderer | G01R 35/00 702/89 |
| 6,459,335 B1 | * | 10/2002 | Darmawaskita | H03F 3/45977 327/124 |
| 7,075,463 B2 | * | 7/2006 | Arimura | H03M 1/0621 341/118 |
| 8,816,886 B1 | * | 8/2014 | Warner | H03M 1/1057 341/120 |
| 9,726,696 B2 | * | 8/2017 | Powell | G01K 7/01 |
| 9,807,504 B2 | * | 10/2017 | Melanson | H03M 3/468 |
| 2010/0103005 A1 | * | 4/2010 | Nolan | H03F 3/195 341/120 |

(Continued)

OTHER PUBLICATIONS

Petrijs, Michael A. P., et al; A CMOS Smart Temperature Sensor with a 3σ Inaccuracy of ± 1° C. From −55° C. to 125° C.; IEE Journal of Solid-State Circuits vol. 40 No. 12; Dec. 2005.

(Continued)

*Primary Examiner* — Linh Nguyen
(74) *Attorney, Agent, or Firm* — Eschweiler & Potashnik, LLC

(57) ABSTRACT

Systems, methods, and circuitries are provided to control a gain setting in an analog-to-digital converter (ADC) that converts an analog signal to a digital signal based on a reference voltage. Temperature compensation circuitry includes a temperature gain correction circuitry and a combination circuitry. The temperature gain correction circuitry is configured to determine a correction term based on a temperature that affects the reference voltage. The combination circuitry is configured to combine the correction term with a calibration gain value to generate a corrected calibration gain value and provide the corrected calibration gain value to the ADC to control the gain setting.

21 Claims, 5 Drawing Sheets

(56) References Cited

U.S. PATENT DOCUMENTS

2011/0316730 A1* 12/2011 Kurachi .............. H03M 1/1028
  341/120
2014/0198820 A1* 7/2014 Sundstrom ............... G01K 7/24
  374/1
2014/0350872 A1* 11/2014 Xu ................. H03K 19/017509
  702/60

OTHER PUBLICATIONS

Shalmany, Saleh Heidary, et al; A Micropower Battery Current Sensor with ± 0.03% Inaccuracy from −40 to +85° C.; ISSCC 2013/ Session 22/ Sensors and Displays/ 22.4; 2013.

Maderbacher, Gerhard, et al; A Digitally Assisted Single-Point-Calibration CMOS Bandgap Voltage Reference with a 3σ Inaccuracy of ± 0.03% for Fuel-Gauge Applications; ISSCC 2015/ Session 5/ Analog Techniques/ 5.8;2015.

Saputra, N., et al; 12-bit accurate voltage sensing ADC with curvature-corrected dynamic reference; Electronic Letters, vol. 46, No. 6; Mar. 18, 2010.

Texas Instruments; bq27421-G1 System-Side Impedance Track™ Fuel Gauge With Integrated Sense Resistor; SLUSB85A; May 2013; Revised Aug. 2014.

* cited by examiner

TEMPERATURE REFERENCE GAIN CORRECTION FOR ANALOG-TO-DIGITAL CONVERTER

FIELD

The present disclosure relates to the field of analog-to-digital converters (ADCs) and in particular to methods, systems, and circuitry for correcting a reference gain for an ADC based on temperature.

BACKGROUND

Most ADCs use a reference voltage to perform the conversion from an analog signal to a digital signal. Even slight variations in the reference voltage impact the consistency and accuracy of the ADC. Changes in temperature affect reference voltage signals due to device physics and manufacturing tolerances for the components that generate the reference voltage signal. Thus, the accuracy of ADCs is often limited by the temperature variation of the reference voltage, which translates into gain error in the ADC.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

The accuracy of ADCs is often limited by the temperature variation of the reference voltage, which translates into ADC gain error. Many ADCs use a "bandgap voltage reference" (also referred to as a "bandgap"), which is a temperature independent voltage reference circuit. A bandgap is designed to produce a fixed or constant voltage that is immune to variation caused by power supply variations, temperature changes, and circuit loading from a device. However, in reality, the bandgap-based reference voltage has both linear and nonlinear temperature variations due to device physics and manufacturing tolerances which can be as large as ±1%. To improve ADC accuracy, temperature variation of the reference voltage is compensated, corrected, or calibrated in the analog or digital domain.

Figure 1A:
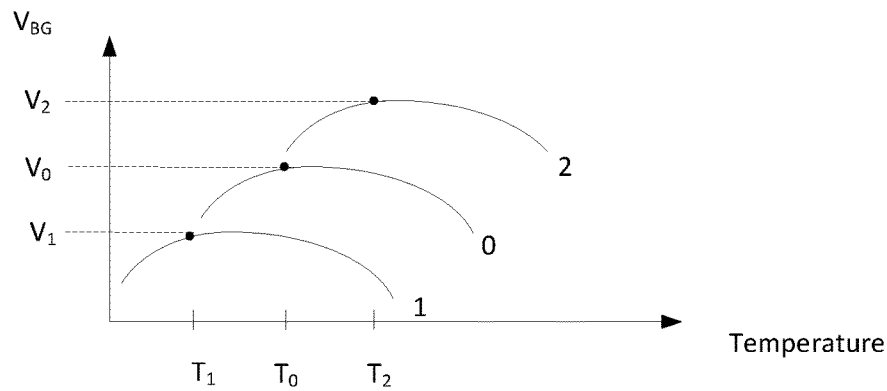
FIG. 1A is a set of curves illustrating temperature variation of bandgap reference voltage for 3 different silicon process corners.
Figure 1B:
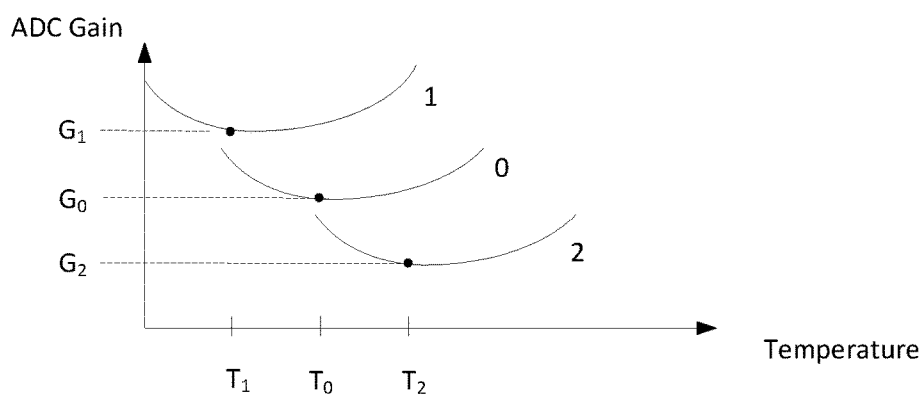
FIG. 1B is a set of curves illustrating resulting ADC Gain temperature variation based on the bandgap reference voltage variation shown in FIG. 1A.
Figure 1C:
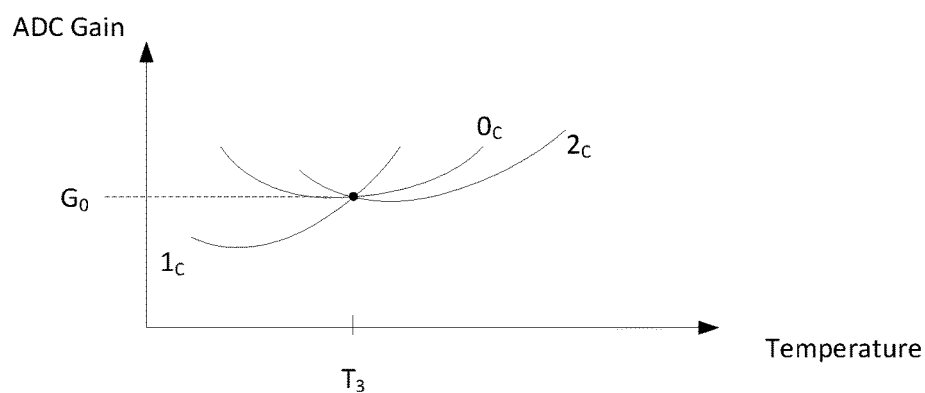
FIG. 1C is a set of curves illustrating ADC gain temperature variation after linear gain calibration is performed at temperature T3.

FIG. 1A shows temperature variation of bandgap reference voltage for 3 different silicon process corners 0, 1, and 2. A "process corner" is a combination of silicon processing parameter values that has a relatively extreme effect on the bandgap's performance. FIG. 1B shows the resulting ADC Gain temperature variation. G0, G1 and G2 are the linear gains which can be calibrated. G0 is the target gain. FIG. 1C shows the ADC gain temperature variation after linear gain calibration at temperature T3. It can be seen that significant nonlinear gain error remains after the linear gain calibration has been performed.

Analog reference voltage correction techniques rely on circuit compensation and utilize analog calibration at one or two known temperatures (which incurs test time cost). The gain error caused by linear temperature variation (silicon process corner dependent) can be corrected using analog trimming, as illustrated in FIGS. 1A-1C. The gain error caused by nonlinear temperature variation (relatively silicon process corner independent) is corrected using separate analog curvature correction circuitry which increases reference voltage circuit complexity and costs to implement the curvature correction. A high accuracy external reference voltage may be used, however, this solution degrades the level of SoC integration and incurs additional system costs and package pins.

Digital reference voltage correction techniques utilize digital post-processing and include calibration at one or two known temperatures (to correct for the linear gain temperature component) as well nonlinear gain correction during digital post-processing based on real time temperature information. Due to the increasing prevalence of digital signal processing (DSP) in Systems on Chip (SoC), digital post-processing is becoming an attractive option for reference voltage correction. For hardware based digital post-processing, polynomial (programmable coefficients) or a lookup table can be used to store finite set of temperature dependent correction factors. These digital post-processing solutions involve hardware or processor based digital arithmetic operations.

Since the reference voltage temperature variation translates into ADC temperature gain error, typically some temperature measurement and a digital multiplication operation is performed for nonlinear gain correction. This means that a processor/firmware intervention or dedicated digital arithmetic hardware is needed to perform the multiplication operation. A processor/firmware is not available in some applications e.g. automotive with functional safety requirements. Dedicated digital arithmetic hardware incurs additional circuit area and power.

Described herein are methods, systems, and circuitries that perform digital post-processing correction of an ADC's gain to compensate for reference voltage variation due to temperature effects with or without using a digital arithmetic multiplication operation. The described methods, systems, and circuitries can be applied to any ADC where the digital gain value is inherent in the conversion and can be adjusted with high resolution. Examples of such ADCs are delta-sigma ADCs with counter based filters (e.g. comb filters), integrating type ADCs (single, dual slope) with discrete time cycles (usually counter based).

Figure 2:
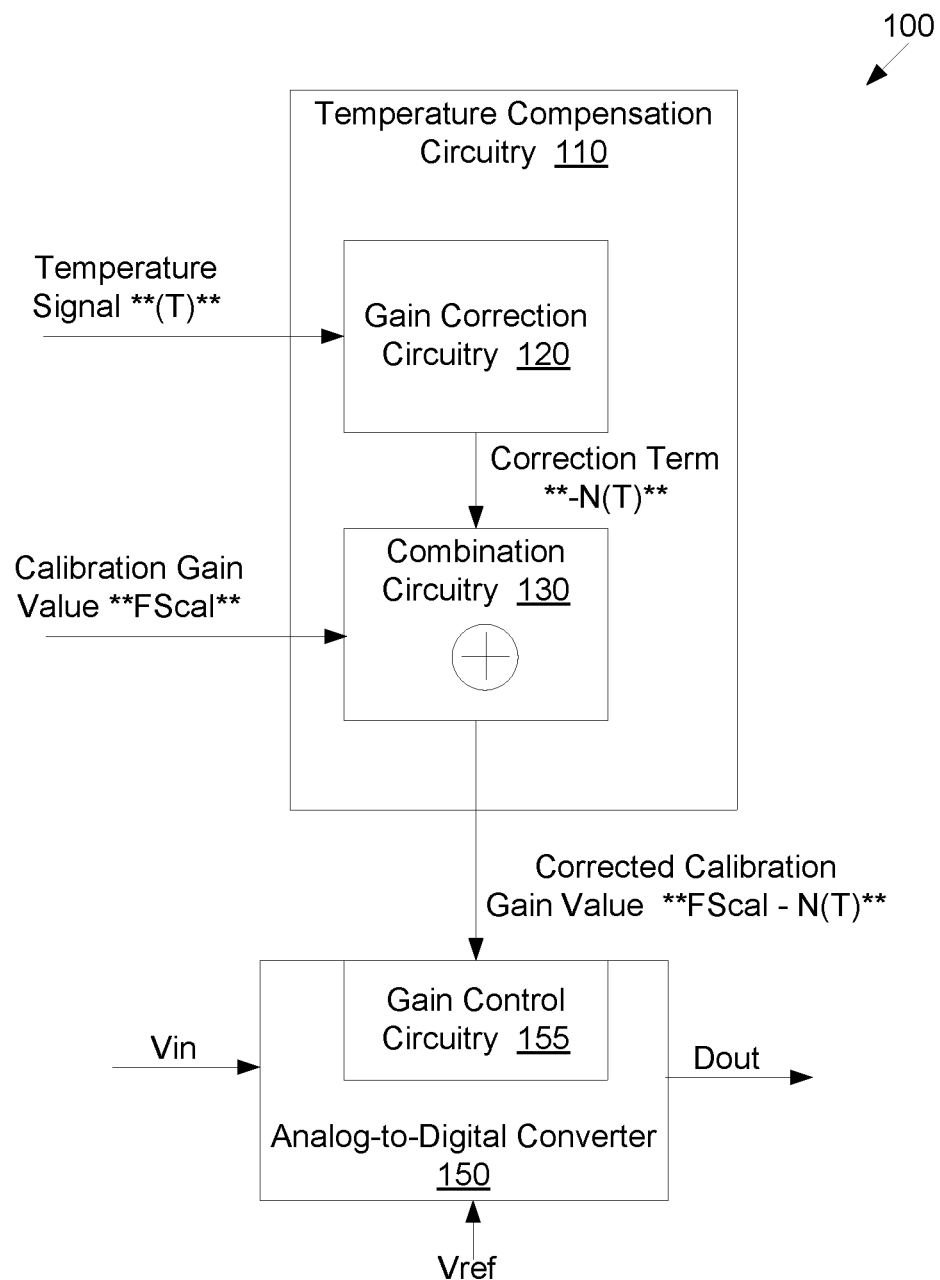
FIG. 2 illustrates one example temperature correction circuitry for use with an ADC in accordance with various aspects described.

FIG. 2 illustrates one example temperature compensation system 100 that is configured to adjust the gain of an ADC 150 to compensate for temperature-induced variations in a reference voltage Vref. In general, Dout (the digital output code generated by the ADC) is equal to a full-scale output code FS multiplied by a ratio between the analog voltage being converted to digital (Vin) and Vref.

$$Dout=FS \cdot Vin/Vref \qquad \text{EQ. 1}$$

The temperature signal (T) indicates a temperature that affects the reference voltage Vref being supplied to the ADC 150. For example, the temperature may be the temperature of or proximate to a bandgap that is generating Vref. The temperature signal may be generated by a temperature sensor, such a reference temperature sensor, that measures the temperature. Alternatively, the temperature signal may be generated "indirectly" based on other sensed parameters of components near the bandgap. The temperature signal may be a temperature segment identifier that identifies a segment or subrange of temperatures in a predetermined segmented range of anticipated operating temperatures. The temperature signal may also be a known temperature dependent input voltage, such as a Proportional to Absolute Temperature (PTAT) voltage generated by a reference temperature sensor. Any other types of temperature signals that are capable of communicating the temperature to the temperature compensation system 100 may also be utilized.

As discussed above with reference to FIGS. 1A-1C, a linear gain calibration is performed on FS to generate a "calibration gain value" FScal (which is equivalent to the calibrated gains 0c, 1c, 2c in FIG. 1C). The linear gain calibration is performed based on a linear relationship between the full-scale gain and a reference voltage to obtain a target gain G0 at a certain calibration temperature T3. The temperature compensation system 110 adjusts the calibration gain value FScal to compensate for nonlinear temperature variations in Vref when the temperature deviates from T3. To accomplish this, the temperature compensation system 100 includes temperature compensation circuitry 110 that generates a corrected calibrated gain value (FScal−N(T)) that is provided to gain control circuitry 155 of the ADC.

The temperature compensation circuitry 110 includes temperature gain correction circuitry 120 that generates the correction term N(T) based on the temperature signal (T). The correction term corrects for the nonlinear effect of the temperature on the reference voltage input to the ADC. The correction term is combined by combination circuitry 130 with the calibration gain value FScal to produce the corrected calibration gain value. In one example, the combination circuitry includes a digital adder. The ADC 150 performs analog to digital conversions as controlled by the gain control circuitry 155 using the corrected calibration gain value generated by the temperature compensation circuitry 110.

Recall that for temperature T, the ADC output Dout(T) =FS*Vin/Vref(T). The reference voltage can be expressed as:

$$Vref(T)=VBE(T)+\Delta*T=VBEO(Tr)+a*T+c(T) \qquad \text{EQ. 2}$$

$$=VBEO(Tr)\{1+h(T)\} \qquad \text{EQ. 3}$$

Where a is the residual linear term in VBE after Proportional to Absolute Temperature (PTAT) compensation:

$$a=\{VBE(Tr)-VBEnom(Tr)\}/Tr \qquad \text{EQ. 4}$$

Where VBE nom(Tr) and VBE (Tr) are the nominal and actual silicon values of VBE(T) at temperature Tr. Due to manufacturing process variations, VBE nom(Tr) and VBE (Tr) are different. The value of a can be measured by calibration at known temperature. It is known that:

$$h(T)=\{a*T+c(T)\}/VBEO(Tr) \qquad \text{EQ. 5}$$

$$c(T)=\beta*(T-Tr-T*Ln(T/Tr)) \qquad \text{EQ. 6}$$

$$\beta=(k/q)*(\eta-m) \qquad \text{EQ. 7}$$

Where the value of β depends on physical constants (k,q) as well as process parameters (η, m), and is best obtained by silicon characterization. m is the bipolar collector current temperature exponent (for PTAT design typically less than 1 due to resistor temperature coefficient). VBEO(Tr) is the ideal reference voltage $Vref_{ideal}$.

Dout(T) can be expressed as:

$$Dout(T)=FS*VIN/[Vref_{ideal}\{1+h(T)\}]=FS(T)*VIN/Vref_{ideal} \qquad \text{EQ. 8}$$

$$\text{Where } FS(T)=FS/\{1+h(T)\} \qquad \text{EQ. 9}$$

For single point calibration at temperature Tc:

$$Dout(Tc)=FS(Tc)*VIN/Vref_{ideal} \qquad \text{EQ. 10}$$

Setting $Dout(Tc)=FS_{ideal}*VIN/Vref_{ideal}$, where $FS_{ideal}$ is the ideal full-scale count $FS(Tc)=FS_{ideal}$:

$$FS=FS_{ideal}*\{1+h(Tc)\}=FS_{ideal}+FS_{ideal}*h(Tc) \qquad \text{EQ. 11}$$

$$FScal=FS_{ideal}+Ncal \qquad \text{EQ. 12}$$

Where $Ncal=integer[FS_{ideal}*h(Tc)]$ and FScal is the digital calibrated full-scale gain defined by Ncal. There is a linear relationship between full-scale gain (FScal) and Vref:

$$Dout(T)=FS*VIN/Vref(T)*VIN \qquad \text{EQ. 13}$$

During calibration at Tc, $$FScal/Vref(Tc)=FS_{ideal}/Vref_{ideal} \qquad \text{EQ. 14}$$

$$FScal=(FS_{ideal}/Vref_{ideal})*Vref(Tc)=G*Vref(Tc) \qquad \text{EQ. 15}$$

where $G=(FS_{ideal}/Vref_{ideal})$ is the linear gain factor.

After calibration, $$Dout(T)=FS(T)*VIN/Vref_{ideal}=[FScal/\{1+h(T)\}]*VIN/Vref_{ideal} \qquad \text{EQ. 16}$$

And for $h(T)<<1$, $1/\{1+h(T)\} \approx \{1-h(T)\}$:

$$Dout(T) \approx [FScal*\{1-h(T)\}]*VIN/Vref_{ideal}=[FScal-FScal*h(T)]*VIN/Vref_{ideal} \qquad \text{EQ. 17}$$

$$=[FScal-N(T)]*VIN/Vref_{ideal} \qquad \text{EQ. 18}$$

Where N(T)=integer[FScal*h(T)] and N(T) is a temperature dependent correction term to be subtracted from the calibrated full scale count FScal. The correction term can be stored in a lookup table (LUT) in one example (see FIG. 3A). With 2's complement format only a digital adder is needed to compute the temperature dependent correction term. This is much less complex compared to digital multiplier.

Figure 3A:
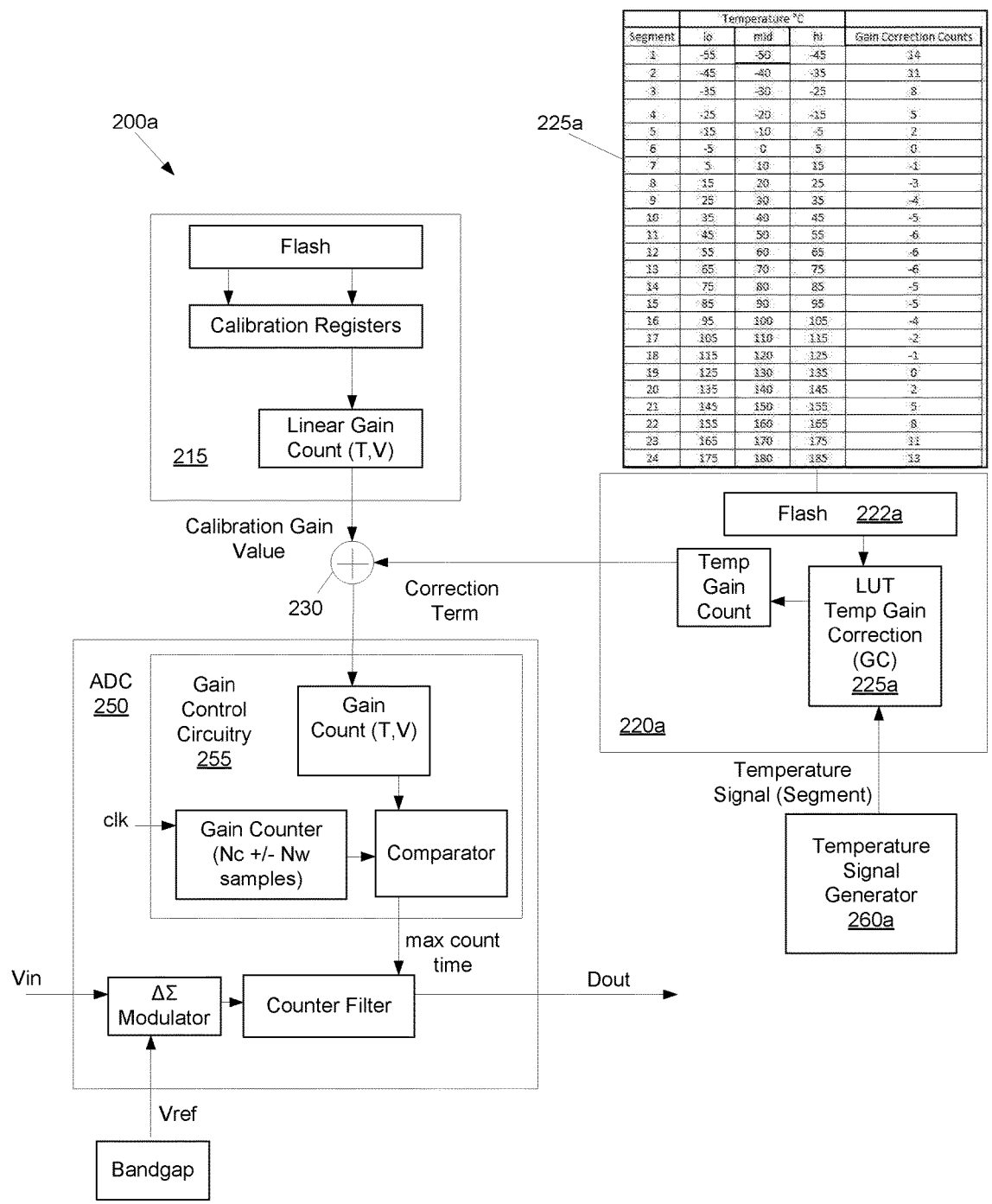
FIG. 3A illustrates an example temperature correction circuitry that includes a lookup table in accordance with various aspects described.

This means that $$Dout(T)=[FS_{ideal}+Ncal-N(T)]*VIN/Vref_{ideal} \qquad \text{EQ. 19}$$

$$=[\{FS_{ideal}+Ncal-N(T)\}/FS_{ideal}]*FS_{ideal}*VIN/Vref_{ideal} \qquad \text{EQ. 20}$$

$$=GainTrim(T)*Dout_{ideal} \qquad \text{EQ. 21}$$

Where $GainTrim(T)=[FS_{ideal}+Ncal-N(T)]/FS_{ideal} \qquad \text{EQ. 22}$ and $Dout_{ideal}=FS_{ideal}*VIN/Vref_{ideal} \qquad \text{EQ. 23}$ FIG. 3A illustrates an example temperature compensation system 200a that utilizes a lookup table to adjust the gain of an ADC 250 to compensate for variations in Vref due to temperature effects. The system 200a includes linear gain adjustment circuitry 215 and temperature gain correction circuitry 220a. A temperature signal generator 260a generates a temperature signal (T), which in the illustrated example identifies a temperature segment from amongst 24 subranges of an anticipated operating range of −55° C. to 185° C. As already discussed above, the temperature signal generator 260a can include a temperature sensor that directly measures a temperature or circuitry that estimates the temperature based on operating parameters of electronic components proximate the system 200a. The temperature signal generator 260a may be a reference temperature sensor that generates a PTAT voltage or a digital representation of the temperature value.

The ADC 250 includes a ΔΣ modulator that generates a series of 1s and 0s based on a comparison between Vin and Vref. To generate Dout, a counter filter counts the number of 1s produced by the modulator during a predetermined number of counts, the "gain count". Gain control circuitry 255 adjusts the counter's gain count time based on a comparison between a stored gain count and a gain counter value. The stored gain count is the corrected calibration gain value generated by the temperature compensation system as will be described now.

The linear gain circuitry 215 generates a linear gain count based on the linear relationship determined between the full-scale gain and the reference voltage obtained during calibration. This gain count value is stored in a flash memory. Upon ADC startup the contents of the flash memory is stored in calibration registers. The linear gain circuitry 215 selects or computes the linear gain count by reading the contents of the calibration registers.

The temperature gain correction circuitry 220a includes a lookup table (LUT) 225a that maps temperature segment to temperature gain counts (correction terms) that can be positive or negative. The LUT 225a illustrates just one example of temperature segments that may be utilized as well as the specific correction terms that are mapped to the temperature segments. The LUT 225a can be stored in flash memory 222a and upon startup made accessible to the temperature gain correction circuitry 220a (e.g., transferred into buffers or registers). Alternatively the LUT can be implemented as hard-coded digital logic. The temperature gain correction circuitry 220a receives a temperature segment identifier (T) and outputs a temperature gain count correction term N(T) mapped to that segment in the LUT 225a. Combination circuitry 230 combines the calibration gain value with the correction term to produce the corrected calibration gain value, which is provided to the ADC as the gain count for the counter filter. In one example, the combination circuitry 230 is a digital adder.

In the system of FIG. 3A, the accuracy of the gain correction depends on the resolutions of the gain count ($1/FS_{ideal}$) and the correction terms. The error in the correction term N(T) is not just the integer rounding error but also the number of discrete temperature points stored in LUT.

$$\text{Error}[N(T)] = FScal*h(T) - \text{integer}[FScal*h(Ti)] \qquad \text{EQ 21}$$

Where Ti is the nearest stored temperature point to the actual temperature T.

Figure 3B:
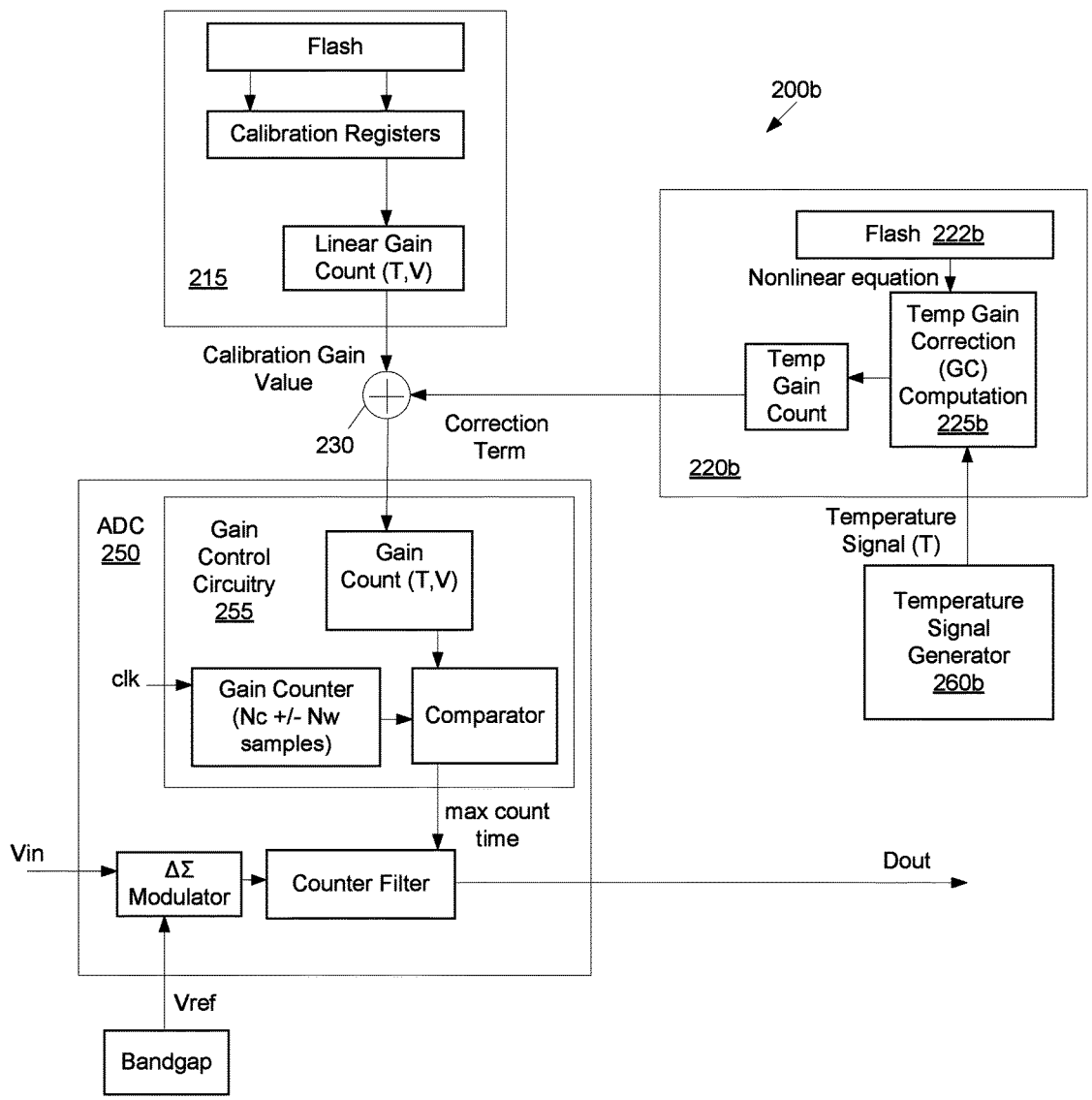
FIG. 3B illustrates another example temperature correction circuitry that includes correction term computation circuitry in accordance with various aspects described.

FIG. 3B illustrates an example temperature compensation system 200b that utilizes temperature gain correction computation circuitry 225b to adjust the gain of an ADC 250 to compensate for variations in Vref due to temperature effects. The system 200b includes linear gain adjustment circuitry 215 and temperature gain correction circuitry 220b. A temperature signal generator 260b generates a temperature signal (T). As already discussed above, the temperature signal generator 260b can include a temperature sensor that directly measures a temperature or circuitry that estimates the temperature based on operating parameters of electronic components proximate the system 200b. The temperature signal generator 260b may be a reference temperature sensor that generates a PTAT voltage or a digital representation of the temperature value.

The ADC 250 includes a ΔΣ modulator that generates a series of 1s and 0s based on a comparison between Vin and Vref. To generate Dout, a counter filter counts the number of 1s produced by the modulator during a predetermined number of counts, the "gain count". Gain control circuitry 255 adjusts the counter's gain count time based on a comparison between a stored gain count and a gain counter value. The stored gain count is the corrected calibration gain value generated by the temperature compensation system as will be described now.

The linear gain circuitry 215 generates a linear gain count based on the measured outputs for known inputs voltage Vin obtained during calibration. This gain count value is stored in a flash memory. Upon ADC startup the contents of the flash memory is stored in calibration registers. The linear gain circuitry 215 selects or computes the linear gain count by reading the contents of the calibration registers.

The temperature gain correction circuitry 220b includes temperature gain computation circuitry 225b that computes the temperature gain count correction term based on the temperature signal (T). The temperature gain computation circuitry 225b computes the correction term based on a nonlinear function of temperature. A nonlinear equation expressing the relationship between temperature and correction term can be stored in flash memory 222b and upon startup is made accessible to the temperature gain correction circuitry 220b (e.g., transferred into buffers or registers). Alternatively the nonlinear equation can be implemented as hard-coded digital logic. The temperature gain correction circuitry 220b receives a temperature signal (T) and outputs a temperature gain count correction term N(T) computed by the temperature gain computation circuitry 225b. Combination circuitry 230 combines the calibration gain value with the correction term to produce the corrected calibration gain value, which is provided to the ADC as the gain count for the counter filter. In one example, the combination circuitry 230 is a digital adder.

Figure 4:
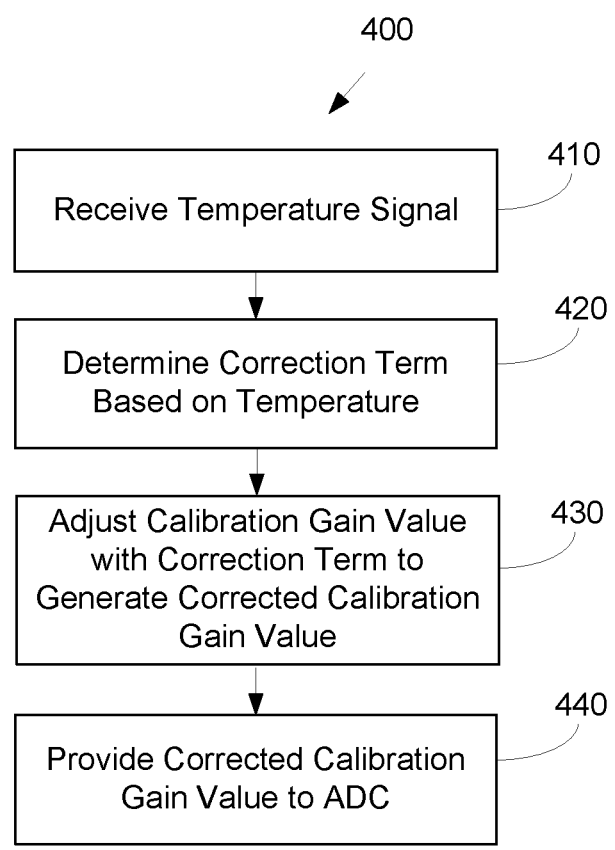
FIG. 4 illustrates one example method for controlling a gain setting for an ADC to compensate for temperature variation in accordance with various aspects described.

FIG. 4 is a flow diagram outlining an example method to control a gain setting for an analog-to-digital converter (ADC) that converts an analog signal to a digital signal based on a reference voltage. The method 400 includes, at 410, receiving a temperature signal indicative of a temperature that affects the reference voltage. At 420, a correction term is determined based on the temperature and at 430, a calibration gain value is adjusted with the correction term to generate a corrected calibration gain value. The method includes, at 440, providing the corrected calibration gain value to gain control circuitry of the ADC.

This disclosure describes one example of digital correction of the voltage reference temperature variation that does not require digital arithmetic multiplication (see, e.g., FIG. 3A). Temperature based compensation of the ADC digital gain is accomplished and can be applied to any ADC where the digital gain count is inherent in the conversion and can be adjusted with high resolution. Examples of such ADCs are delta-sigma ADCs with counter based filter, integrating type ADCs (single, dual slope) with discrete time cycles (usually counter based).

It can be seen from the foregoing description that the described systems, circuitries, and methods adjust an ADC's gain to compensate for variations in reference voltage due to temperature effects. In some examples, the described systems, circuitries, and methods provide real-time temperature correction in a digital post-processing solution with a simplified implementation that does not rely on a multiplication operation (see, e.g., FIG. 3A).

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, circuitries, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a temperature compensation circuitry configured to control a gain setting in an analog-to-digital converter (ADC) that converts an analog signal to a digital signal based on a reference voltage, including temperature gain correction circuitry and combination circuitry. The temperature gain correction circuitry is configured to determine a correction term based on a temperature that affects the reference voltage. The combination circuitry is configured to combine the correction term with a calibration gain value to generate a corrected calibration gain value; and provide the corrected calibration gain value to the ADC to control the gain setting.

Example 2 includes the subject matter of example 1, including or omitting optional elements, wherein the temperature gain correction circuitry is configured to: receive, from a temperature sensor, a signal indicative of the temperature; and determine the correction term based on the temperature.

Example 3 includes the subject matter of example 2, including or omitting optional elements, wherein the signal includes a Proportional to Absolute Temperature voltage.

Example 4 includes the subject matter of example 2, including or omitting optional elements, wherein the signal includes a digital representation of the temperature.

Example 5 includes the subject matter of example 2, including or omitting optional elements, wherein the signal is generated by a temperature sensor disposed proximate the ADC.

Example 6 includes the subject matter of example 2, including or omitting optional elements, wherein the signal is generated based on a thermal model that maps temperature values to one or more other component operating parameters based on a thermal simulation.

Example 7 includes the subject matter of example 1, including or omitting optional elements, wherein the temperature gain correction circuitry includes a lookup table that maps temperatures to correction terms based on a nonlinear relationship between the temperature and a reference voltage input to the ADC.

Example 8 includes the subject matter of example 1, including or omitting optional elements, wherein the temperature gain correction circuitry is configured to compute the correction term based on a nonlinear equation that includes the temperature.

Example 9 includes the subject matter of example 1, including or omitting optional elements, wherein the calibration gain value includes a calibrated full scale gain value based on a linear relationship between a full-scale gain and a reference voltage input to the ADC.

Example 10 is a method configured to control a gain setting for an analog-to-digital converter (ADC) that converts an analog signal to a digital signal based on a reference voltage. The method includes: receiving a temperature signal indicative of a temperature that affects the reference voltage; determining a correction term based on the temperature; adjusting a calibration gain value with the correction term to generate a corrected calibration gain value; and providing the corrected calibration gain value to gain control circuitry of the ADC.

Example 11 includes the subject matter of example 10, including or omitting optional elements, further including measuring the temperature with a temperature sensor that generates the signal.

Example 12 includes the subject matter of example 10, including or omitting optional elements, wherein the signal includes a Proportional to Absolute Temperature voltage.

Example 13 includes the subject matter of example 10, including or omitting optional elements, wherein the signal includes a digital representation of the temperature.

Example 14 includes the subject matter of example 10, including or omitting optional elements, wherein the determining includes: inputting the signal to a lookup table that maps temperatures to corresponding correction terms; and determining an output of the lookup table as the correction term.

Example 15 includes the subject matter of example 14, including or omitting optional elements, wherein the lookup table maps temperatures to corresponding correction terms based on a nonlinear relationship between temperature and a reference voltage input to the ADC.

Example 16 includes the subject matter of example 10, including or omitting optional elements, wherein the determining includes calculating the correction term based on a nonlinear equation that includes the temperature.

Example 17 includes the subject matter of example 10, including or omitting optional elements, wherein the calibration gain value includes a calibrated full scale gain value based on a linear relationship between a full scale gain and a reference voltage input to the ADC.

Example 18 includes the subject matter of example 17, including or omitting optional elements, wherein the calibrated full scale gain value is determined during calibration of the ADC.

Example 19 is a temperature compensated analog-to-digital converter (ADC), including: an ADC configured to convert an input voltage to a digital signal based on a reference voltage, the ADC including gain control circuitry that controls operation of the ADC based on a gain count and a temperature compensation system. The temperature compensation system is configured to receive a temperature signal indicative of a temperature; generate a corrected calibration gain value based on a nonlinear relationship between the temperature and the reference voltage; and provide the corrected calibration gain value to the gain control circuitry as the gain count.

Example 20 includes the subject matter of example 19, including or omitting optional elements, wherein the temperature compensation system includes a lookup table that maps temperatures to correction terms based on a nonlinear relationship between the temperature and the reference voltage.

Example 21 includes the subject matter of example 19, including or omitting optional elements, wherein the temperature compensation system includes temperature gain correction computation circuitry configured to compute a correction term based on a nonlinear equation that includes the temperature.

Example 22 includes the subject matter of example 19, including or omitting optional elements, wherein the corrected calibration gain value includes a calibrated full scale gain value adjusted by a correction term that is based on the nonlinear relationship, wherein the calibrated full scale gain value is based on a linear relationship between a full scale gain and a reference voltage input to the ADC.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

Various illustrative logics, logical blocks, modules, circuitries, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include field gates, logical components, hardware encoded logic, register transfer logic, one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

What is claimed is:

1. A temperature compensation system configured to control a gain setting in an analog-to-digital converter (ADC) that converts an analog signal to a digital signal based on a reference voltage, comprising:
   a linear gain adjustment circuitry configured to determine a calibration gain value, wherein the calibration gain value corrects for linear effects of temperature on the reference voltage;
   a temperature gain correction circuitry configured to determine a correction term based on a temperature that affects the reference voltage, wherein the correction term corrects for nonlinear effects of temperature on the reference voltage; and
   a combination circuitry configured to:

combine the correction term with the calibration gain value to generate a corrected calibration gain value; and provide the corrected calibration gain value to the ADC to control the gain setting.

2. The temperature compensation system of claim 1 wherein the temperature gain correction circuitry is configured to:

receive, from a temperature sensor, a signal indicative of the temperature; and determine the correction term based on the temperature.

3. The temperature compensation system of claim 2, wherein the signal comprises a Proportional to Absolute Temperature voltage.

4. The temperature compensation system of claim 2, wherein the signal comprises a digital representation of the temperature.

5. The temperature compensation system of claim 2, wherein the signal is generated by a temperature sensor disposed proximate the ADC.

6. The temperature compensation system of claim 2, wherein the signal is generated based on a thermal model that maps temperature values to one or more other component operating parameters based on a thermal simulation.

7. The temperature compensation system of claim 1, wherein the temperature gain correction circuitry comprises a lookup table that maps temperatures to correction terms based on a nonlinear relationship between the temperature and a reference voltage input to the ADC.

8. The temperature compensation system of claim 1, wherein the temperature gain correction circuitry is configured to compute the correction term based on a nonlinear equation that includes the temperature.

9. The temperature compensation system of claim 1, wherein the calibration gain value comprises a calibrated full scale gain value based on a linear relationship between a full-scale gain and a reference voltage input to the ADC.

10. A method configured to control a gain setting for an analog-to-digital converter (ADC) that converts an analog signal to a digital signal based on a reference voltage, the method comprising:

determining a calibration gain value that corrects for linear effects of temperature on the reference voltage;

receiving a temperature signal indicative of a temperature that affects the reference voltage;

based on the temperature, determining a correction term that corrects for nonlinear effects of temperature on the reference voltage;

combining the calibration gain value with the correction term to generate a corrected calibration gain value; and controlling the ADC based at least on the corrected calibration gain value.

11. The method of claim 10, further comprising measuring the temperature with a temperature sensor that generates the signal.

12. The method of claim 10, wherein the signal comprises a Proportional to Absolute Temperature voltage.

13. The method of claim 10, wherein the signal comprises a digital representation of the temperature.

14. The method of claim 10, comprising:

inputting the signal to a lookup table that maps temperatures to corresponding correction terms; and determining an output of the lookup table as the correction term.

15. The method of claim 14, wherein the lookup table maps temperatures to corresponding correction terms based on a nonlinear relationship between temperature and a reference voltage input to the ADC.

16. The method of claim 10, comprising calculating the correction term based on a nonlinear equation that includes the temperature.

17. The method of claim 10, wherein the calibration gain value comprises a calibrated full scale gain value based on a linear relationship between a full scale gain and a reference voltage input to the ADC.

18. The method of claim 17, wherein the calibrated full scale gain value is determined during calibration of the ADC.

19. A temperature compensated analog-to-digital converter (ADC), comprising:

an ADC configured to convert an input voltage to a digital signal based on a reference voltage, the ADC comprising gain control circuitry that controls operation of the ADC based on a gain count; and a temperature compensation system configured to:

determine a calibration gain value that corrects for linear effects of temperature on the reference voltage;

receive a temperature signal indicative of a temperature;

based on the temperature, determine a correction term that corrects for nonlinear effects of temperature on the reference voltage;

combining the calibration gain value with the correction term to generate a corrected calibration gain value; and provide the corrected calibration gain value to the gain control circuitry as the gain count.

20. The temperature compensated ADC of claim 19, wherein the temperature compensation system comprises a lookup table that maps temperatures to correction terms based on a nonlinear relationship between the temperature and the reference voltage.

21. The temperature compensated ADC of claim 19, wherein the temperature compensation system comprises temperature gain correction computation circuitry configured to compute a correction term based on a nonlinear equation that includes the temperature.

* * * * *